(12) United States Patent
Gao et al.

(10) Patent No.: US 11,380,367 B2
(45) Date of Patent: Jul. 5, 2022

(54) THERMALLY MAINTAINABLE BUILT-IN STORAGE TRAY STRUCTURE

(71) Applicant: INSPUR SUZHOU INTELLIGENT TECHNOLOGY CO., LTD, Suzhou (CN)

(72) Inventors: Honggang Gao, Suzhou (CN); Xiu Chi, Suzhou (CN)

(73) Assignee: INSPUR SUZHOU INTELLIGENT TECHNOLOGY CO., LTD, Suzhou (CN)

(*) Notice: Subject to any disclaimer, the term of this patent is extended or adjusted under 35 U.S.C. 154(b) by 0 days.

(21) Appl. No.: 17/281,208

(22) PCT Filed: Oct. 31, 2019

(86) PCT No.: PCT/CN2019/114529
§ 371 (c)(1),
(2) Date: Mar. 29, 2021

(87) PCT Pub. No.: WO2020/258628
PCT Pub. Date: Dec. 30, 2020

(65) Prior Publication Data
US 2021/0400832 A1   Dec. 23, 2021

(30) Foreign Application Priority Data

Jun. 24, 2019 (CN) .......................... 201910547018.6

(51) Int. Cl.
| | |
|---|---|
| H05K 7/20 | (2006.01) |
| G11B 33/12 | (2006.01) |
| H05K 7/14 | (2006.01) |
| G11B 33/14 | (2006.01) |

(52) U.S. Cl.
CPC .......... *G11B 33/128* (2013.01); *G11B 33/142* (2013.01); *H05K 7/1487* (2013.01); *H05K 7/20145* (2013.01); *H05K 7/20727* (2013.01)

(58) Field of Classification Search
CPC ... G11B 33/128; G11B 33/142; G11B 33/126; G11B 33/0461; G11B 25/10;
(Continued)

(56) References Cited

U.S. PATENT DOCUMENTS

2015/0366095 A1* 12/2015 Junkins ................ H05K 5/0004
312/319.2

FOREIGN PATENT DOCUMENTS

| CN | 103793022 A | 5/2014 |
| CN | 206864188 U | 1/2018 |

(Continued)

OTHER PUBLICATIONS

International Search Report of the International Searching Authority for China National Intellectual Property Administration in PCT application No. PCT/CN2019/114529 dated Feb. 26, 2020, which is an international application corresponding to this U.S. application.

(Continued)

*Primary Examiner* — Mandeep S Buttar
(74) *Attorney, Agent, or Firm* — Kolitch Romano LLP

(57) ABSTRACT

A thermally maintainable built-in storage tray structure can include a case main frame body; a storage unit tray is positioned within the case main frame body, and wherein the storage united is configured to be positioned at a front end of a server together with a mainboard and a PCI_E and the storage unit tray is moveably connected to the case main frame body and is capable of be pulling out of the case main frame body; a middle flip rack provided at a middle part and a rear flip rack provided at a rear part of the storage unit tray, the middle flip rack and the rear flip rack are hinged to the storage unit tray.

19 Claims, 8 Drawing Sheets

(58) Field of Classification Search
CPC ............... H05K 7/1487; H05K 7/1489; H05K 7/20727; H05K 7/1488; H05K 7/20145; H05K 7/183; H05K 7/20645; H05K 7/20136; H05K 7/14; G06F 1/20; G06F 1/187; G06F 1/183; G06F 1/188; G06F 1/184; G06F 1/206; G06F 3/0689
USPC ......... 361/727, 679.02, 679.33, 679.31, 724, 361/679.48, 679.4, 679.49, 679.5, 690, 361/695, 725, 726; 360/98.01
See application file for complete search history.

(56) References Cited

FOREIGN PATENT DOCUMENTS

| | | |
|---|---|---|
| CN | 207337298 U | 5/2018 |
| CN | 208314687 U | 1/2019 |
| CN | 208459909 U | 2/2019 |
| CN | 109634378 A | 4/2019 |
| CN | 110381691 A | 10/2019 |
| WO | 2012039968 A1 | 3/2012 |

OTHER PUBLICATIONS

The State Intellectual Property Office of People's Republic of China, First Office Action in Patent Application No. 201910547018.6 dated Mar. 26, 2020, which is a foreign counterpart application corresponding to this U.S. Patent Application, to which this application claims priority.

The State Intellectual Property Office of People's Republic of China, Second Office Action in Patent Application No. 201910547018.6 dated Sep. 17, 2020, which is a foreign counterpart application corresponding to this U.S. Patent Application, to which this application claims priority.

\* cited by examiner

THERMALLY MAINTAINABLE BUILT-IN STORAGE TRAY STRUCTURE

This application is a national phase of international application no. PCT/CN2019/114529, filed on Oct. 31, 2019, entitled "Thermally Maintainable Built-In Storage Tray Structure." The international application claims the benefit of priority from CN Application No. 201910547018.6, filed on Jun. 24, 2019, titled "A Thermally Maintainable Built-In Storage Tray Structure." Both of these applications are incorporated herein in its entirety.

TECHNICAL FIELD

The present application relates to the field of servers, and more particularly, relates to a thermally maintainable built-in storage tray structure.

BACKGROUND

Conventional 2U architecture hard disks are arranged at the front end, and mainboards and PCI_Es (peripheral component interconnect express) which is a high-speed serial computer expansion bus standard are arranged at the back end. Therefore, maintenance is required both in the front and rear end of the cabinet during maintenance, which not only requires a large amount of maintenance, but also has a low maintenance efficiency. To solve this problem, the present application has developed a thermally maintainable built-in storage tray structure.

SUMMARY

The purpose of the present disclosure is to provide a thermally maintainable built-in storage tray structure to overcome the deficiencies in the prior art. In one aspect of the present disclosure, the hard disk storage unit, mainboard and PCI_E unit are moved to the front end of the server, and the storage and computing layers are separated by dividing the upper and lower U. In order to achieve the hot-swappable requirements of the hard disk, the storage tray is designed in a pull-out mode, and a flippable first cover plate is designed between the front-row hard disk module and the rear-row hard disk module. When the middle and last row of modules are being maintained, the first cover plate is opened first, and then the module that needs maintenance is flipped. The first cover plate is restored to the original position after the module is flipped over, so that the first cover plate is in contact with the bottom of the hard disk module to form a closed air duct. After the closed air duct is formed, the flow resistance of the front module is the same as that of the module being rotated and raised, and the air flow will flow through the hard disk to dissipate heat, which ensures the effect of thermal maintenance.

The embodiments of present disclosure, in order to achieve the purpose above, provide technical solution as following:

A thermally maintainable built-in storage tray frame includes a case main frame body and a storage unit tray. The storage unit tray is provided within the case main frame body. In order to solve the problem of maintenance difficulties for the configuration where the hard disk, the mainboard and PCI_E are arranged respectively at the front and rear end of the server, the storage unit tray, a mainboard and a PCI_E are all arranged at the front end of the server. An upper layer U and a lower layer U are provided within the case main frame body, the upper layer U is a computing layer and the lower layer U is a storage layer, which avoids front-end congestion or insufficient space caused by the hard disk, mainboard and PCI_E being all arranged at the front end of the server. Both sides of the storage unit tray are connected to the inner walls on both sides of the case main frame body through ball guide rails. The ball guide rails are commercially available mature products. For example, Shengfei SF-4007/SF-4008 ball guide rail is used, and its structure will not be described in detail.

The storage unit tray is set as a pull-out type, which solves the problem that the hard disk is difficult to maintain in the lower layer U3. Several air inlets are provided at the front part of the storage unit. A cooling fan is provided at the front part of the case main frame body. The cooling fan draws cold air from the front part of the storage unit into the case main frame body to cool the storage layer inside the case main frame body and extract the hot air. In order to reduce the length of the hard disk module, the flip racks are provided at the rear part and the middle position of the storage unit tray. Both sides of one end of the flip racks are hinged to the storage unit tray. A first lug is provided on both sides of the lower part of one end of the flip racks. Several first pinholes are provided on one end of the first lug. A hinge is provided on the upper part of the storage unit tray. One end of the hinge is provided with a second pinhole that matches with the first pinhole. The first pinhole and the second pinhole are movably connected by a pin shaft. A third lug is provided on both sides of the upper part of the other end of the flip racks.

Several evenly arranged vertical plates are provided on the flip rack and the front part of the storage unit tray. The lower part of the vertical plate on the front of the storage unit tray is connected to the storage unit tray by a connecting plate. The lower part of the vertical plate on the flip rack is connected to the flip rack by a connecting plate. A first guide plate is provided on the vertical plate. A second guide plate is provided on one side of the upper part of the first guide plate. Brackets are provided both between the first guide plate and the connecting plate and between the second guide plate and the first guide plate. The bracket is used to install hard disk. The hard disks installed on the front part of the storage unit tray constitute the front-row hard disk module. The hard disks installed on the middle flip rack constitute the middle hard disk module, and the hard disks installed on the rear flip rack constitute a rear-row hard disk module. In order to install more hard disks, the front-row hard disk module, middle hard disk module and rear-row hard disk module are arranged to be at least have two layers. The flip rack is provided with a baffle plate on one side, and the baffle plate is used to limit the position of the hard disk when it is installed. The baffle plate is provided with several first vent holes which are located at the gap between an upper hard disk layer and a lower hard disk layer. The first cover plate is provided in the gaps between the front-row hard disk module and the middle hard disk module, between the middle hard disk module and the rear-row hard disk module, and between the rear-row hard disk module and the rear wall of the storage unit tray. A second lug is provided on both sides of the front part of the first cover plate. The second lug is movably connected to the storage unit tray to realize the flip function of the first cover plate. A lap joint is provided on both sides of the rear part of the first cover plate. The lap joint is lapped on a third lug of the flip rack. A buckle plate is provided on the outside of the lap joint, and makes both sides of the first cover plate buckle on the outside of the flip rack to ensure the stability of the installation of the first cover plate and the flip rack.

In some embodiments, the upper part of the vertical plate is provided with a second cover plate which is detachably connected with the vertical plate by screws. The second cover plate avoids the hard disk module from falling off and ensures the hard disk module reliability.

In some embodiments, the lower part of the flip rack is provided with several sets of second vent holes which are located directly under the hard disk. The second vent holes ensure the cooling effect of the cold air on the bottom of the hard disk, thereby ensuring thermal maintenance effect of the storage unit.

In some embodiments, a first limiting plate is provided on one side of the first pinhole. An acute angle of 30°-45° is formed between the first limiting plate and the lug. The first limit plate avoids the data cable between the hard disk modules from falling off due to the excessive flip angle of the flip rack, which ensures the reliability of the thermal maintenance of the hard disk module.

In some embodiments, a second limiting plate is provided on one side of the hinge. The second limiting plate is an offset L-shaped, and the second limiting plate is located on the upper part of the first pinhole. After the flip rack is flipped over to a certain angle, the front end of the second limiting plate abuts against the first lug, which avoids the data cable from falling off due to the excessive flip angle of the flip rack and further ensures the reliability of the thermal maintenance of the hard disk module.

In some embodiments, one side of the upper part of the flip rack is provided with several sets of bosses. Each set of bosses comprises two bosses between which a slot is formed. The lower part of the baffle plate is installed within the slot. The hook is provided on one side of the vertical plate. The baffle plate is provided with a hook hole adapted to the hook. When the baffle is installed, the lower end of the baffle plate is clamped inside the slot, and the upper part of the baffle plate is connected to the hook through a hook hole. The detachable baffle plate facilitates the maintenance of the baffle plate and reduces the maintenance cost of the baffle plate.

In some embodiments, a wrench is provided on one side of the bracket. The wrench includes an anti-falling portion and a pressing portion. The anti-falling portion is inclined to the inner side of the hard disk and forms an angle of 60°-85° with the bracket. The anti-falling portion avoids the hard disk from falling off from the front end of the bracket. The pressing portion is integrally formed at one end of the anti-falling portion to facilitate the dragging of the bracket during the maintenance of the hard disk, so that the hard disk to be maintained can be taken out.

In some embodiments, the first guide plate is a hollow long strip shaped, and the hollow part of the first guide plate and the lower part of the second guide plate are both provided with a third vent hole which strengthens air circulation between the hard disk module, and thereby enhances the cooling and heat dissipation effect between the hard disk modules.

In some embodiments, several leak-proof devices are provided on both sides of the first cover plate. One end of the leak-proof device is detachably connected to the first cover plate by screws, and the other end of the leak-proof device is contacted with the hard disk module. The leak-proof device ensures the wind direction between the hard disk modules and avoids poor heat dissipation of parts of hard disk modules caused by the formation of an open space between the hard disk module and the first cover plate, and the leak-proof device is arranged in a detachable connection mode reducing the maintenance and use cost of the leak-proof device.

In some embodiments, the leak-proof device is a soft brush or soft foam which avoids the leak-proof device from causing abrasion to the hard disk module.

The present disclosure achieves the following beneficial effects.

1) The flippable first cover plate is designed between the front-row hard disk module and the rear-row hard disk module. When the middle and last row of modules are being maintained, the first cover plate is first flipped, and then the module that needs maintenance is flipped. The first cover plate is restored to the original position after the module is flipped over, so that the first cover plate is in contact with the bottom of the module to form a closed air duct. After the closed air duct is formed, the flow resistance of the front module is the same as that of the module being rotated and raised, and the air flow will flow through the hard disk to dissipate heat, which ensures the effect of thermal maintenance.

2) The upper part of the vertical plate is provided with a second cover plate which is detachably connected with the vertical plate by screws. The second cover plate avoids the hard disk module from falling off and ensures the reliability of the hard disk module.

3) The lower part of the flip rack is provided with several sets of second vent holes which are located directly under the hard disk. The second vent holes ensure the cooling and heat dissipation effect of the cold air on the bottom of the hard disk, thereby ensuring thermal maintenance effect of the storage unit.

4) The first limiting plate is provided on one side of the first pinhole. The acute angle of 30°-45° is formed between the first limiting plate and the lug. The first limit plate avoids the data cable between the hard disk modules from falling off due to the excessive flip angle of the flip rack, which ensures the reliability of the thermal maintenance of the hard disk module.

5) A second limiting plate is provided on one side of the hinge. The second limiting plate is an offset L-shaped, and the second limiting plate is located on the upper part of the first pinhole. After the flip rack is flipped over to a certain angle, the front end of the second limiting plate abuts against the first lug, which avoids the data cable from falling off due to the excessive flip angle of the flip rack and further ensures the reliability of the thermal maintenance of the hard disk module.

6) One side of the upper part of the flip rack is provided with several sets of bosses. Each set of bosses comprises two bosses between which a slot is formed. The lower part of the baffle plate is installed within the slot. The hook is provided on one side of the vertical plate. The baffle plate is provided with a hook hole adapted to the hook. When the baffle is installed, its lower end is clamped inside the slot, and its upper part is connected to the hook through the hook hole. The detachable baffle plate facilitates the maintenance of the baffle plate and reduces the maintenance cost of the baffle plate.

7) A wrench is provided on one side of the bracket and includes an anti-falling portion and a pressing portion. The anti-falling portion is inclined to the inner side of the hard disk and forms an angle of 60°-85° with the bracket. The anti-falling portion avoids the hard disk from falling off from the front end of the bracket. The pressing portion is integrally formed at one end of the anti-falling portion to facilitate the dragging of the bracket during the maintenance of the hard disk, so that the hard disk to be maintained can be taken out.

8) The first guide plate is a hollow long strip shaped, and the hollow part of the first guide plate and the lower part of the second guide plate are both provided with a third vent hole which strengthens air circulation between the hard disk modules, and thereby enhances the cooling and heat dissipation effect between the hard disk modules.

9) Several leak-proof devices are provided on both sides of the first cover plate. One end of the leak-proof device is detachably connected to the first cover plate by screws, and the other end of the leak-proof device is contacted with the hard disk module. The leak-proof device ensures the wind direction between the hard disk modules and avoids poor heat dissipation of parts of hard disk modules caused by the formation of an open space between the hard disk module and the first cover plate, and the leak-proof device is arranged in a detachable connection mode reducing the maintenance and use cost of the leak-proof device.

10) The leak-proof device is a soft brush or soft foam which avoids the wear and tear of the hard disk module caused by the leak-proof device.

DETAILED DESCRIPTION

Figure 1:
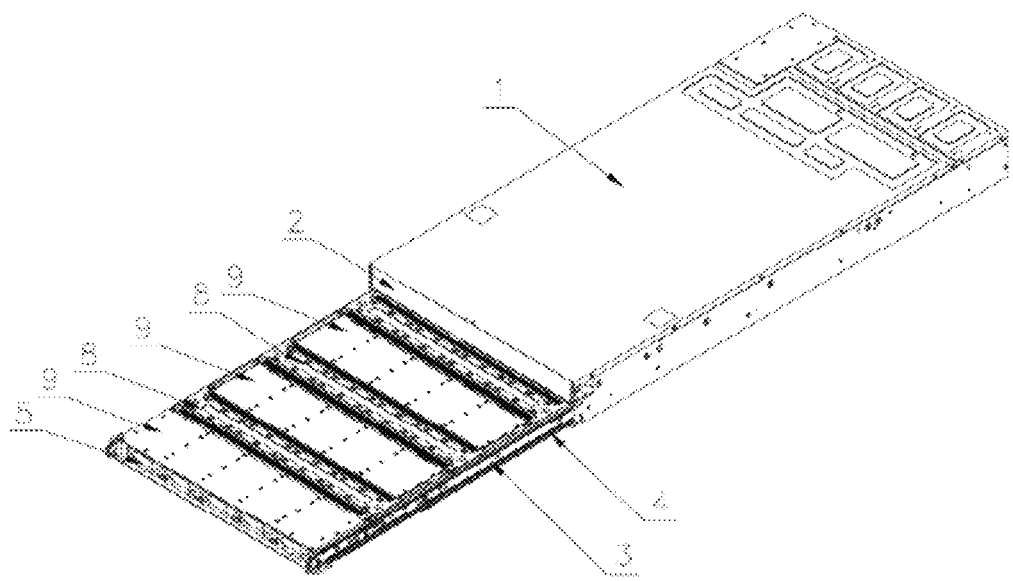
FIG. 1 shows a pull-out state of a thermally maintainable built-in storage tray structure of the present disclosure.

The technical solutions in the embodiments of the present disclosure will be described below clearly and completely with reference to FIGS. 1-12. Obviously, the described embodiments are only a part of the embodiments of the present disclosure, rather than all the embodiments. Based on the embodiments of the present disclosure, all other embodiments obtained by those of ordinary skill in the art without creative work shall fall within the protection scope of the present disclosure.

In the description of the present disclosure, it should be understood that the orientation or positional relationship indicated by the terms "longitudinal", "lateral", "upper", "lower", "front", "rear", "left", "right", "vertical", "horizontal", "top", "bottom", "inner", "outer", etc. is based on the orientation or positional relationship shown in the drawings, and is only for the convenience of describing the present disclosure, rather than indicating or implying that the device or element referred to must have a specific orientation, be configured and operated in a specific orientation, and therefore cannot be understood as a limitation to the present disclosure.

Figure 2:
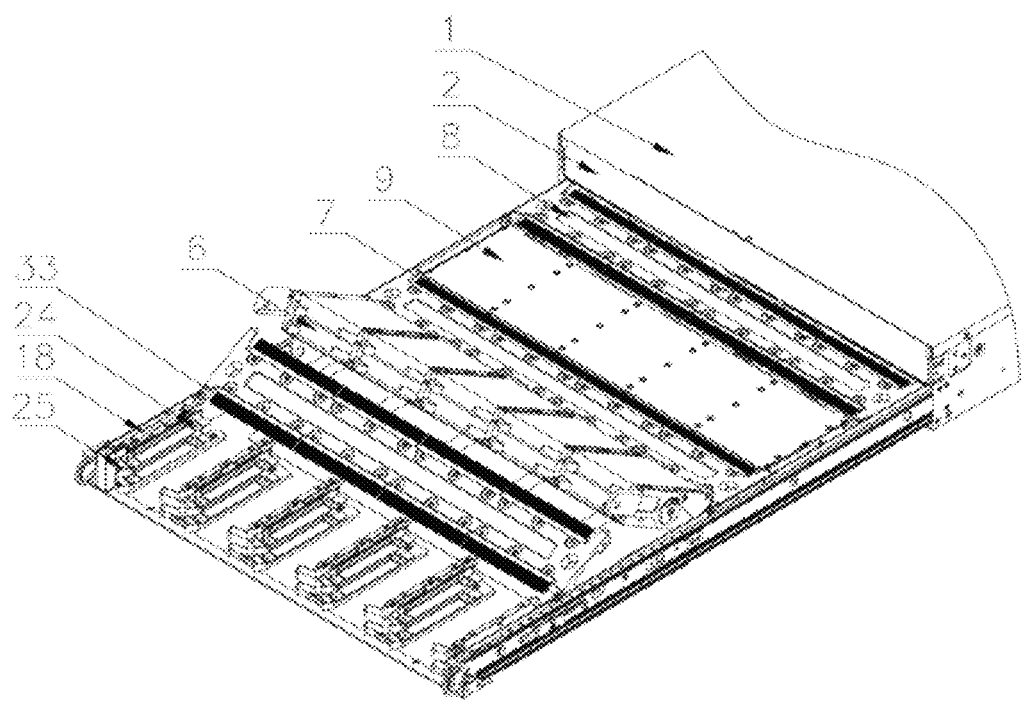
FIG. 2 shows a flipped-over state of a middle hard disk module in a thermally maintainable built-in storage tray structure of the present disclosure.
Figure 3:
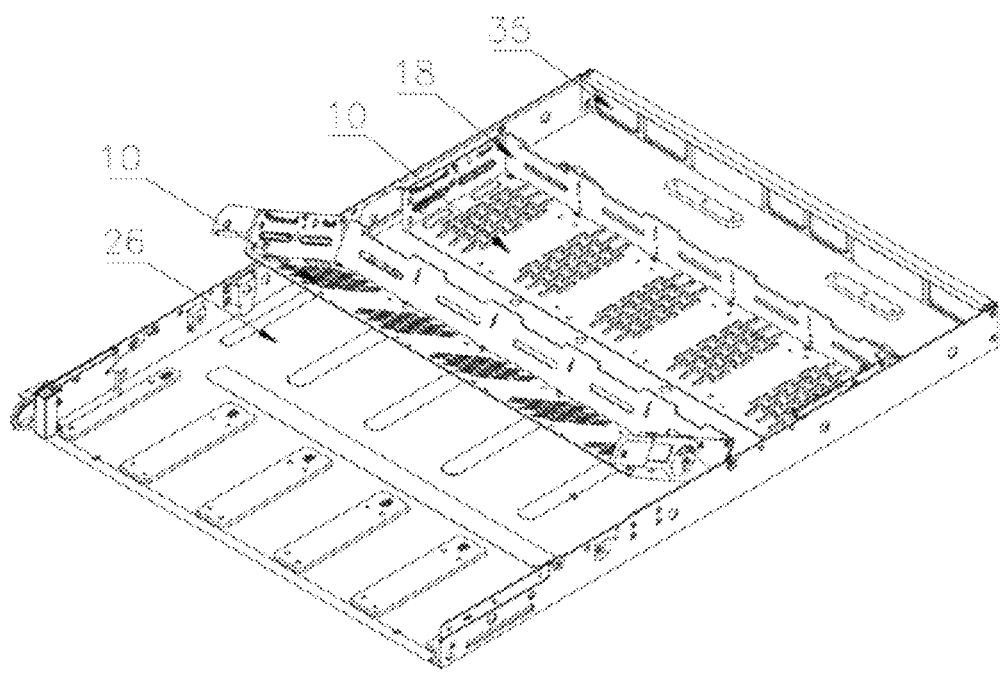
FIG. 3 shows a hard disk module box of a thermally maintainable built-in storage tray structure of the present disclosure.

FIGS. 1-12 illustrate a thermally maintainable built-in storage tray frame according to embodiments of the present disclosure. Referring to FIGS. 1-3, the thermally maintainable built-in storage tray frame includes a case main frame body 1 and a storage unit tray 26. The storage unit tray 26 is provided within the case main frame body 1. In order to solve the problem of maintenance difficulties caused by the hard disk, the mainboard and PCI_E being arranged respectively at the front and rear end of the server, the storage unit tray 26, a mainboard and a PCI_E are all arranged at the front end of the server. An upper layer U 2 and a lower layer U 3 are provided within the case main frame body 1, the upper layer U 2 is a computing layer and the lower layer U 3 is a storage layer, which avoids front-end congestion or insufficient space caused by the hard disk, mainboard and PCI_E being all arranged at the front end of the server. Both sides of the storage unit tray 26 are connected to the inner walls on both sides of the case main frame body 1 through ball guide rails 4. The ball guide rails 4 are commercially available mature products. For example, Shengfei SF-4007/SF-4008 ball guide rail is used, and its structure will not be described in detail. The storage unit tray 26 is set as a pull-out type, which solves the problem that the hard disk is difficult to maintain in the lower layer U 3.

Referring to FIG. 3, several air inlets 35 are provided at the front part of the storage unit 26. A cooling fan is provided at the front part of the case main frame body 1. The cooling fan draws cold air from the front part of the storage unit into the case main frame body 1 to cool the storage layer inside the case main frame body 1 and extract the hot air.

Figure 9:
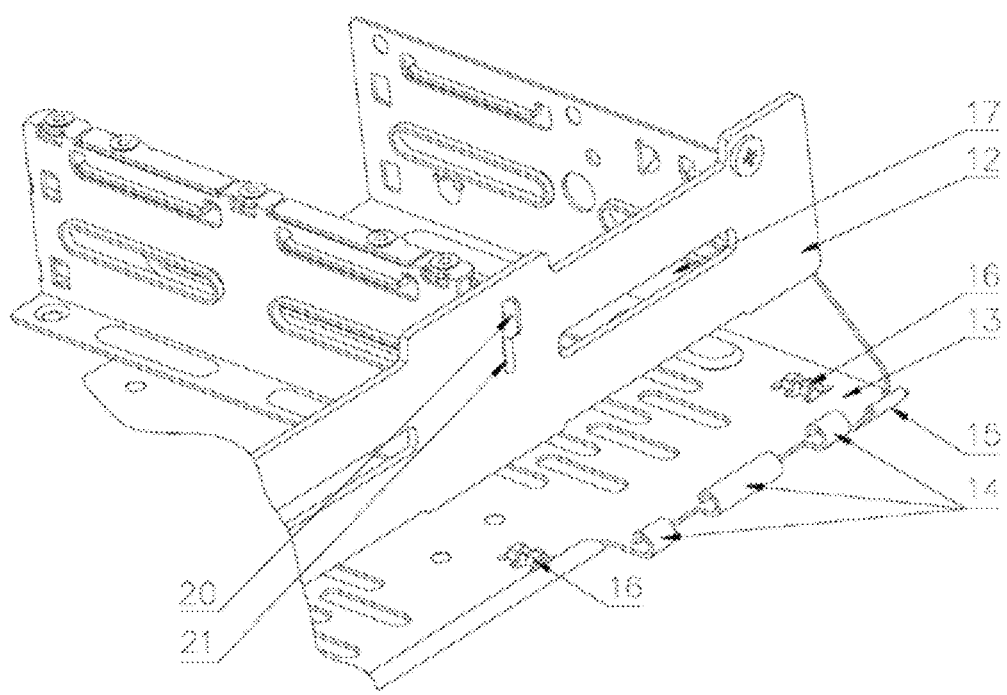
FIG. 9 shows a baffle plate in a thermally maintainable built-in storage tray structure of the present disclosure.

Referring to FIGS. 3-6, flip racks 10 are provided at the rear part and the middle position of the storage unit tray 26. Both sides of one end of the flip rack 10 are hinged to the storage unit tray 26. A first lug 13 is provided on both sides of the lower part of one end of the flip rack 10. With further reference to FIG. 9, several first pinholes 14 are provided on one end of the first lug 13. A hinge 27 is provided on the upper part of the storage unit tray 26. One end of the hinge 27 is provided with a second pinhole 29 that matches with the first pinhole 14. The first pinhole 14 and the second pinhole 29 are movably connected by a pin shaft 30. A third lug 36 is provided on both sides of the upper part of the other end of the flip rack 10.

Figure 7:
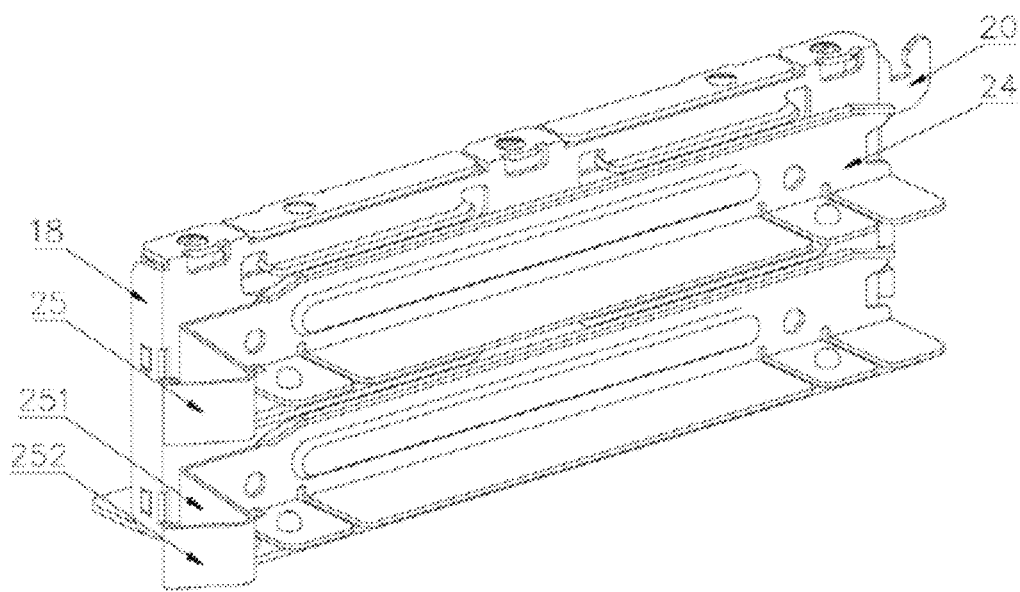
FIG. 7 shows a vertical plate in a thermally maintainable built-in storage tray structure of the present disclosure.
Figure 8:
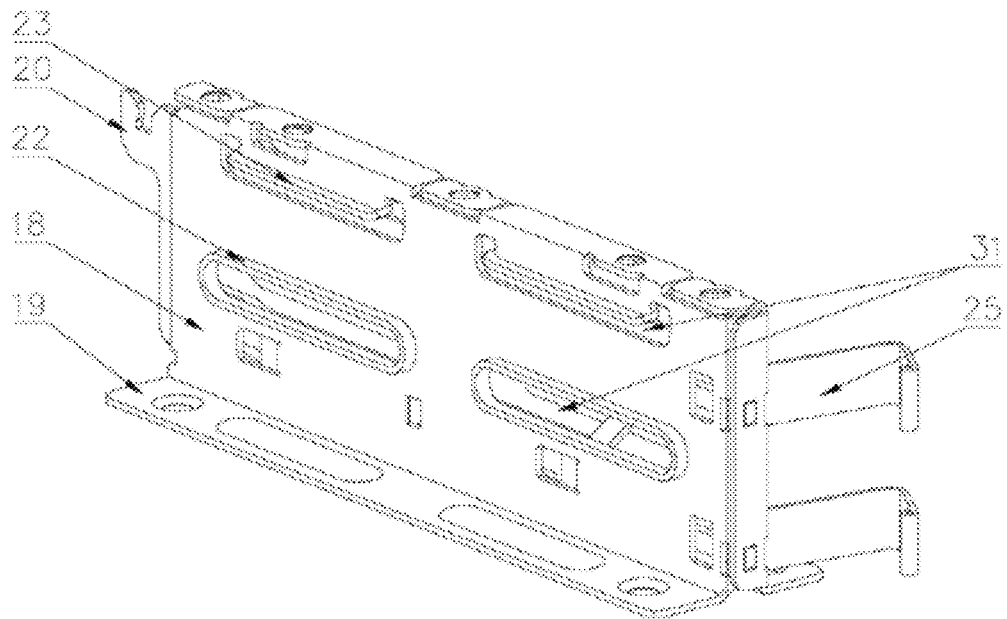
FIG. 8 shows another side of the vertical plate in a thermally maintainable built-in storage tray structure of the present disclosure.

Referring to FIGS. 3 and 7-8, several evenly arranged vertical plates 18 are provided on the flip rack 10 and the front part of the storage unit tray 26. The lower part of the vertical plate 18 on the front of the storage unit tray 26 is connected to the storage unit tray 26 by a connecting plate 19. The lower part of the vertical plate 18 on the flip rack 10 is connected to the flip rack 10 by a connecting plate 19. A first guide plate 22 is provided on the vertical plate 18. A second guide plate 23 is provided on one side of the upper part of the first guide plate 22. Brackets 24 are provided both between the first guide plate 22 and the connecting plate 19 and between the second guide plate 23 and the first guide plate 22. The bracket 24 is used to install the hard disk.

With further reference to FIGS. 1-2, the hard disks installed on the front part of the storage unit tray 26 constitute s front-row hard disk module 5. The hard disks installed on the middle flip rack 10 constitutes middle hard disk module 6, and the hard disks installed on the rear flip rack 10 constitute a rear-row hard disk module 7. In order to install more hard disks, the front-row hard disk module 5, middle hard disk module 6 and rear-row hard disk module 7 are configured to have at least have two layers.

Figure 5:
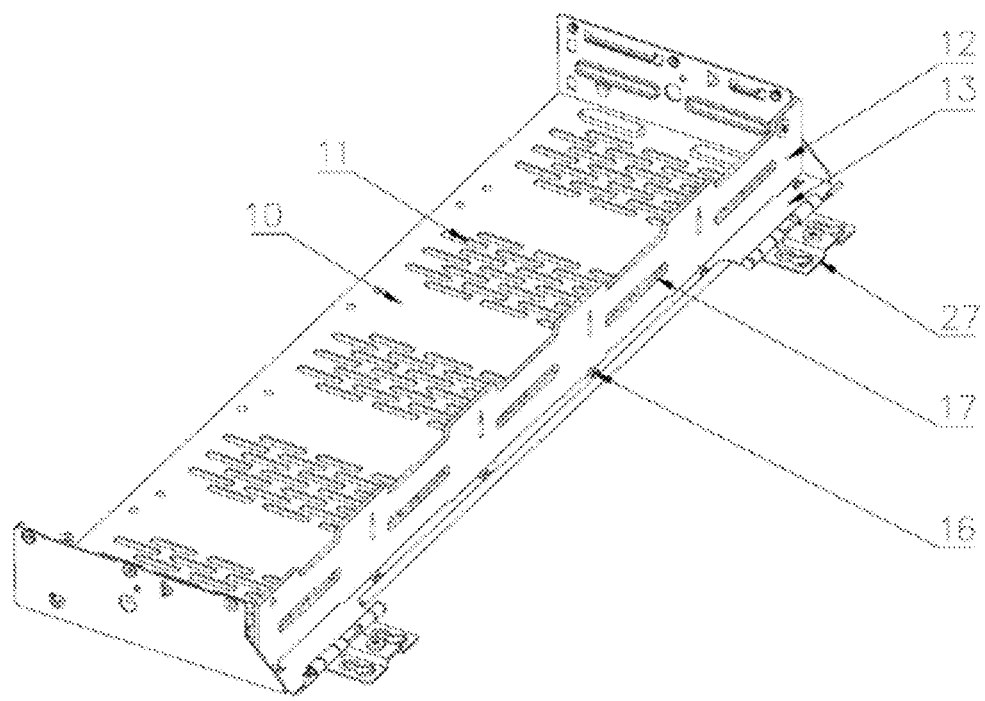
FIG. 5 shows a flip rack in a thermally maintainable built-in storage tray structure of the present disclosure.

With further reference to FIG. 5, the flip rack 10 is provided with a baffle plate 12 on one side, and the baffle plate 12 is used to limit the position of the hard disk when it is installed. The baffle plate 12 is provided with several first vent holes 17 which are located at the gap between an upper hard disk layer and a lower hard disk layer.

Referring to FIGS. 1-2, 10-12, the first cover plate 8 is provided in the gaps between the front-row hard disk module 5 and the middle hard disk module 6, between the middle hard disk module 6 and the rear-row hard disk module 7, and between the rear-row hard disk module 7 and the rear wall of the storage unit tray 26. A second lug 32 is provided on both sides of the front part of the first cover plate 8. The second lug 32 is movably connected to the storage unit tray 26 to realize the flip function of the first cover plate 8. A lap joint 34 is provided on both sides of the rear part of the first cover plate 8. The lap joint 34 is lapped on a third lug 36 of the flip rack 10 (see FIG. 4). A buckle plate is provided on the outside of the lap joint 34, and makes both sides of the first cover plate 8 buckle on the outside of the flip rack 10 to ensure the stability of the installation of the first cover plate 8 and the flip rack 10.

Referring to FIGS. 1-2, the upper part of the vertical plate 18 is provided with a second cover plate 9 which is detachably connected with the vertical plate 18 by screws. The second cover plate 9 avoids the hard disk module from falling off and ensures the hard disk module reliability.

Figure 4:
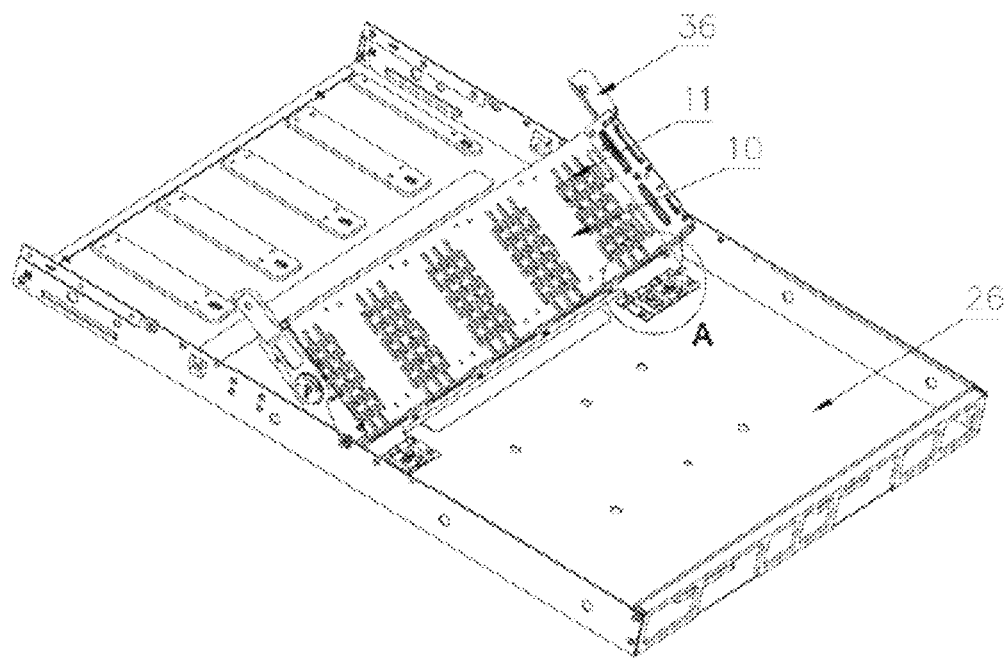
FIG. 4 shows another side of the hard disk module box in a thermally maintainable built-in storage tray structure of the present disclosure.

Referring to FIG. 3-4, the lower part of the flip rack 10 is provided with several sets of second vent holes 11 which are located directly under the hard disk. The second vent holes 11 ensure the cooling effect of the cold air on the bottom of the hard disk, thereby ensuring thermal maintenance effect of the storage unit.

Figure 6:
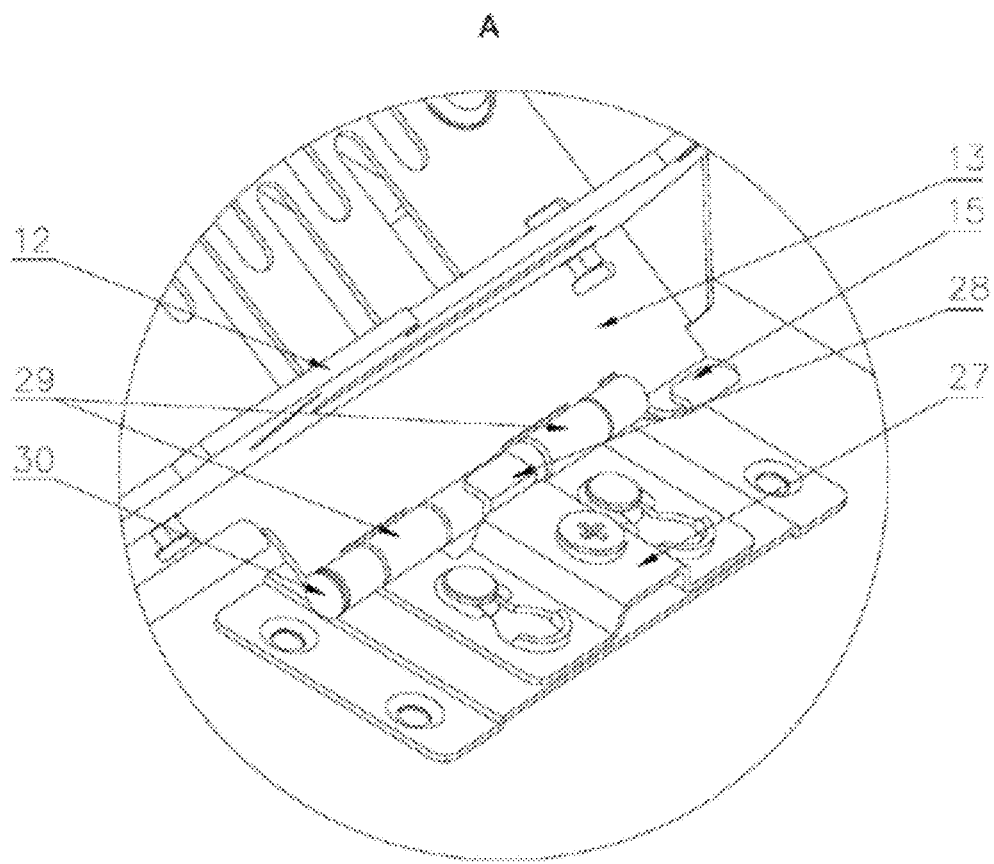
FIG. 6 is a partial enlarged view of A in a thermally maintainable built-in storage tray structure of the present disclosure.

Referring to FIG. 6, a first limiting plate 15 is provided on one side of the first pinhole 14. An acute angle of 30°-45° is formed between the first limiting plate 15 and the lug. The first limit plate 15 avoids the data cable between the hard disk modules from falling off due to the excessive flip angle of the flip rack 10, which ensures the reliability of the thermal maintenance of the hard disk module.

Continuing with FIG. 6, a second limiting plate 28 is provided on one side of the hinge 27. The second limiting plate 28 is an offset L-shaped, and the second limiting plate 28 is located on the upper part of the first pinhole 14. After the flip rack 10 is flipped over to a certain angle, the front end of the second limiting plate 28 abuts against the first lug 13, which avoids the data cable from falling off due to the excessive flip angle of the flip rack 10 and further ensures the reliability of the thermal maintenance of the hard disk module.

Referring to FIG. 5, one side of the upper part of the flip rack 10 is provided with several sets of bosses 16. Each set of bosses 16 comprises two bosses 16 between which a slot is formed. Referring to FIG. 9, the lower part of the baffle plate 12 is installed within the slot. The hook 20 is provided on one side of the vertical plate 18. The baffle plate 12 is provided with a hook hole 21 adapted to the hook 20. When the baffle is installed, the lower end of the baffle plate 12 is clamped inside the slot, and the upper part of the baffle plate 12 is connected to the hook 20 through a hook hole 21. The detachable baffle plate 12 facilitates the maintenance of the baffle plate 12 and reduces the maintenance cost of the baffle plate 12.

Referring to FIGS. 7-8, a wrench 25 is provided on one side of the bracket 24. The wrench 25 includes an anti-falling portion 251 and a pressing portion 252. The anti-falling portion 251 is inclined to the inner side of the hard disk and forms an angle of 60°-85° with the bracket 24. The anti-falling portion 251 avoids the hard disk from falling off from the front end of the bracket 24. The pressing portion 252 is integrally formed at one end of the anti-falling portion 251 to facilitate the dragging of the bracket 24 during the maintenance of the hard disk, so that the hard disk to be maintained can be taken out.

Continuing with FIGS. 7-8, the first guide plate 22 is a hollow long strip shaped, and the hollow part of the first guide plate 22 and the lower part of the second guide plate 23 are both provided with a third vent hole 31 which strengthens air circulation between the hard disk modules, and thereby enhances the cooling and heat dissipation effect between the hard disk modules.

Figure 10:
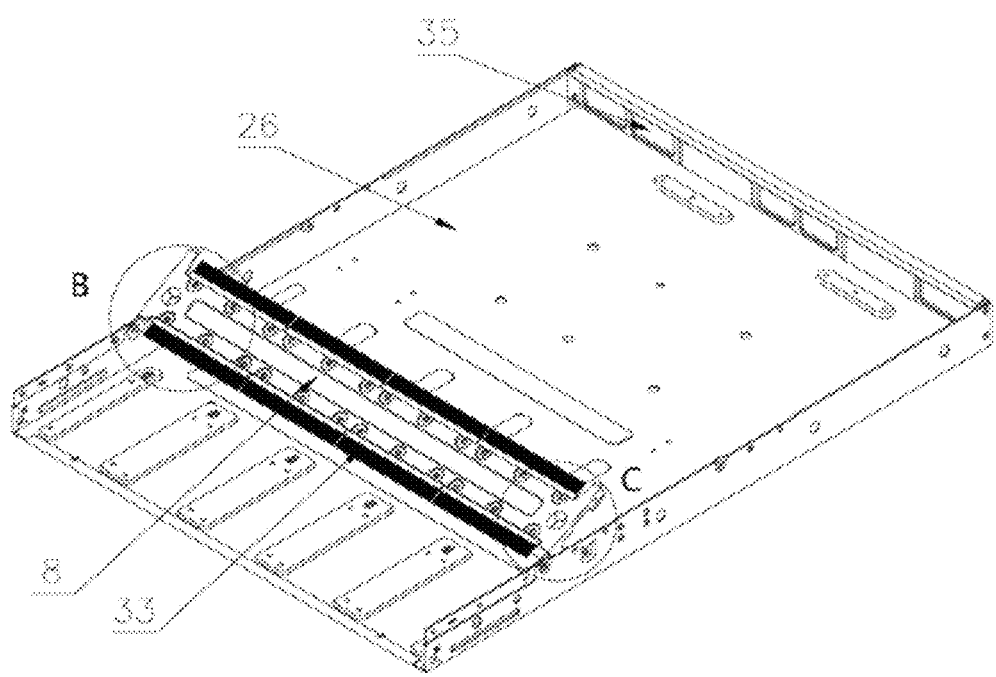
FIG. 10 shows a first cover plate installed in a thermally maintainable built-in storage tray structure of the present disclosure.
Figure 11:
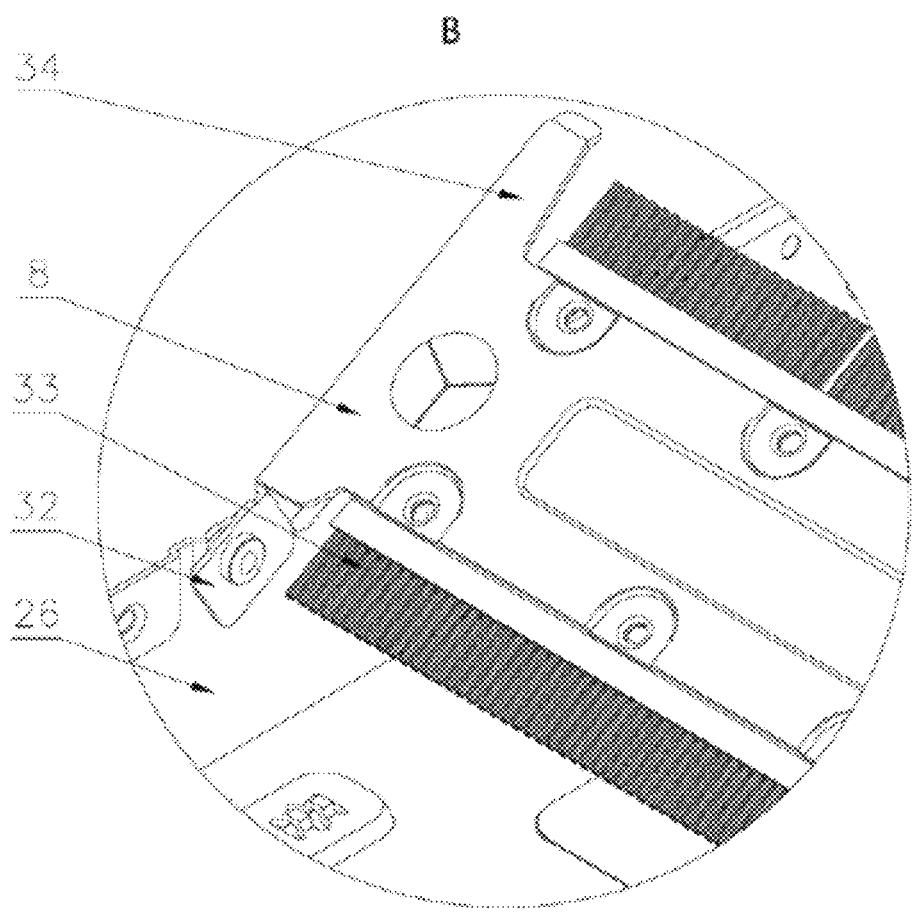
FIG. 11 is a partial enlarged view of B in a thermally maintainable built-in storage tray structure of the present disclosure.
Figure 12:
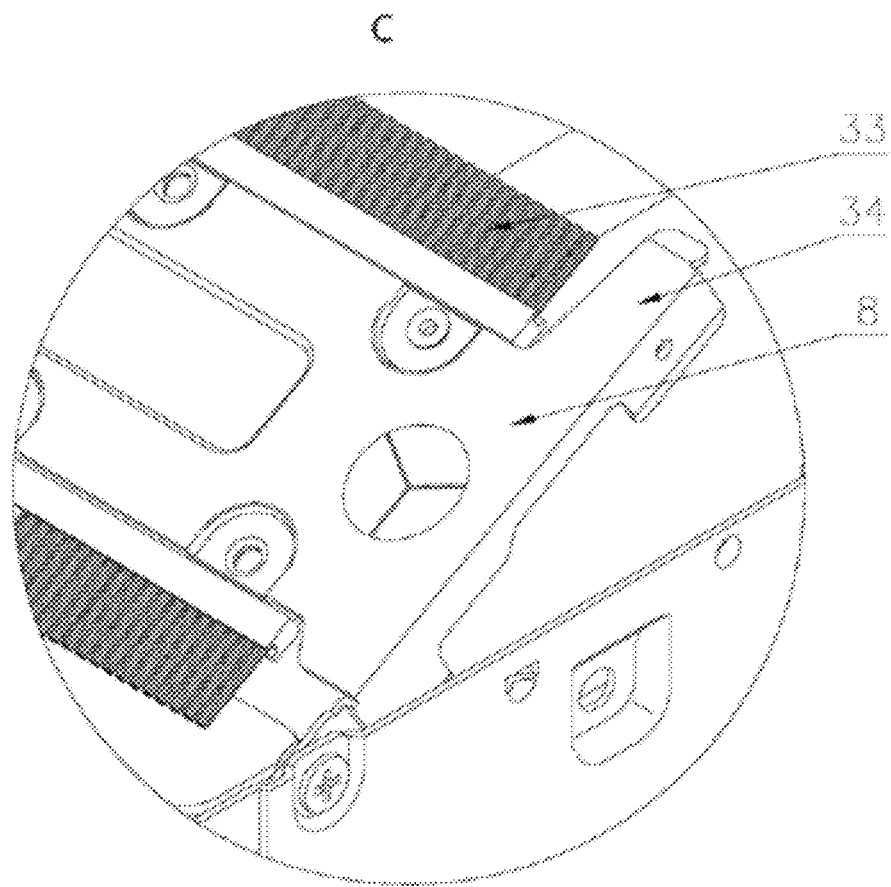
FIG. 12 is a partial enlarged view of C in a thermally maintainable built-in storage tray structure of the present disclosure.

Referring to FIGS. 10-12, several leak-proof devices 33 are provided on both sides of the first cover plate 8. One end of the leak-proof device 33 is detachably connected to the first cover plate 8 by screws, and the other end of the leak-proof device 33 is contacted with the hard disk module. The leak-proof device 33 ensures the wind direction between the hard disk modules and avoids poor heat dissipation of parts of hard disk modules caused by the formation of an open space between the hard disk module and the first cover plate 8, and the leak-proof device 33 is arranged in a detachable connection mode reducing the maintenance and use cost of the leak-proof device 33.

The leak-proof device 33 is a soft brush or soft foam which avoids the leak-proof device 33 from causing abrasion to the hard disk module.

The operation process of the thermally maintainable built-in storage tray structure is as follows: during the thermal maintenance of the hard disk module, the storage unit tray 26 is first pull out of the case main frame body 1 and the front-row hard disk module 5 can be directly maintained. When the middle hard disk module 6 or the rear-row hard disk module 7 is thermal-maintained, the first cover plate 8 on the front part of the corresponding hard disk module is first flipped, and then the flip rack 10 on the hard disk module that needs maintenance is flipped. The first limiting plate 15 and the second limiting plate 28 avoid the data cable from falling off due to the excessive flip angle of the flip rack 10. The first cover plate 8 is restored to the original position after the hard disk module is flipped over, so that the first cover plate 8 is in contact with the bottom of the hard disk module to form a closed air duct between the hard disk modules. The leak-proof device 33 further ensures the airtightness of the air duct. After the closed air duct is formed, the flow resistance of the front module is the same as that of the module being rotated and raised, and the air flow will flow through the hard disk to dissipate heat, which ensures the effect of thermal maintenance.

In one aspect, a thermally maintainable built-in storage tray structure may comprise a case main frame body; a storage unit tray is positioned within the case main frame body, and wherein the storage unit tray is configured to be positioned at a front end of a server together with a mainboard and a PCI_E, the storage unit tray is moveably connected to the case main frame body and is capable of be pulling out of the case main frame body; a middle flip rack provided at a middle part and a rear flip rack provided at a rear part of the storage unit tray, the middle flip rack and the rear flip rack are hinged to the storage unit tray. A front part of the storage unit tray is configured to install a front-row hard disk module, the middle flip rack is configured to install a middle hard disk module and the rear flip rack is configured to install a rear-row hard disk module.

In one embodiment, a front first cover plate is provided in a gap between the front-row hard disk module and the middle hard disk module, a middle first cover plate is provided in a gap between the middle hard disk module and the rear-row hard disk module, and a rear first cover is provided in a gap between the rear-row hard disk module and a rear wall of the storage unit tray, respectively; wherein the front, middle and rear first cover plate are moveable. At an open position, the front first cover plate allows the middle flip rack being flipped for thermal maintenance, and when the middle flip rack is flipped, the front first cover plate is restored to a normal position to be in contact with a bottom of the middle hard disk module to form a closed air duct between the front-row hard disk module and the middle hard disk module. At an open position, the middle first cover plate allows the rear flip rack being flipped for thermal maintenance, and when the rear flip rack is flipped, the middle first cover plate is restored to a normal position to be in contact with a bottom of the rear hard disk module to form a closed air duct between the middle hard disk module and the rear hard disk module.

In another embodiment, leak-proof devices are provided on both sides of the front, middle and rear first cover plate, respectively. In one example, the leak-proof device is a soft brush or soft foam.

In another embodiment, both sides of the storage unit tray are connected to inner walls on both sides of the case main frame body through ball guide rails.

In another embodiment, both sides of one end of each of the front, middle and rear flip racks are hinged to the storage unit tray, a first lug is provided on both sides of the lower part of one end of each of the front, middle and rear flip racks, a plurality of first pinholes are provided on one end of the first lug, a hinge is provided on an upper part of the storage unit tray; one end of the hinge is provided with a second pinhole that matches with the first pinhole, the first pinhole and the second pinhole are movably connected by a pin shaft; a third lug is provided on both sides of an upper part of the other end of each of the front, middle and rear flip racks.

In another embodiment, the thermally maintainable built-in storage tray structure further comprises a plurality of evenly arranged vertical plates provided on each of the front, middle and rear flip racks and the front part of the storage unit tray, a lower part of the vertical plate on the front part of the storage unit tray is connected to the storage unit tray by a connecting plate, a lower part of the vertical plate on each of the front, middle and rear flip racks is connected to each of the front, middle and rear flip racks by a connecting plate, a first guide plate is provided on the vertical plate; a second guide plate is provided on one side of an upper part of the first guide plate.

In another embodiment, the thermally maintainable built-in storage tray structure further comprises brackets for installing hard disks provided both between the first guide plate and the connecting plate, and between the second guide plate and the first guide plate, In another embodiment, each of the front, middle and rear flip rack is provided with a baffle plate on one side, and the baffle plate is provided with several first vent holes which are located at a gap between an upper hard disk layer and a lower hard disk layer.

In another embodiment, a second lug is provided on both sides of the front part of each of the front, middle and rear first cover plates and movably connected to the storage unit tray, a lap joint is provided on both sides of a rear part of the each of the front, middle and rear first cover plates and lapped on a third lug of each of the front, middle and rear flip rack, and a buckle plate is provided on the outside of the lap joint.

In another embodiment, the lower part of each of the front, middle and rear flip rack is provided with a plurality sets of vent holes which are located directly under the hard disks.

The above content is merely an example and description of the structure of the present disclosure. Those skilled in the art make various modifications or additions to the specific embodiments described or use similar alternatives, as long as they do not deviate from the structure of the disclosure or beyond the scope defined by the claims, they all shall belong to the protection scope of the present disclosure.

LIST OF REFERENCE NUMERALS 1 a case main frame body
2 an upper layer U
3 a lower layer U
4 a ball guide rail
5 a front-row hard disk module
6 a middle hard disk module
7 a rear-row hard disk module
8 a first cover plate
9 a second cover
10 a flip rack
11 a second vent hole
12 a baffle plate
13 a first lug
14 a first pinhole
15 a first limiting plate
16 a boss
17 a first vent hole
18 a vertical plate
19 a connecting plate
20 a hook
21 a hook hole
22 a first guide plate
23 a second guide plate
24 a bracket
25 a wrench
251 an anti-falling portion
252 a pressing portion
26 a storage unit tray
27 a hinge
28 a second limiting plate
29 a second pinhole
30 a pin shaft
31 a third vent hole
32 a second lug
33 a leak-proof device
34 a lap joint
35 an air inlet
36 a third lug

The invention claimed is:

1. A thermally maintainable built-in storage tray structure, comprising a case main frame body and a storage unit tray, wherein the storage unit tray is provided within the case main frame body, the storage unit tray, a mainboard and a PCI_E are all arranged at a front end of a server; an upper layer U and a lower layer U are provided within the case main frame body, the upper layer U is a computing layer and the lower layer U is a storage layer; both sides of the storage unit tray are connected to inner walls on both sides of the case main frame body through ball guide rails; several air inlets are provided at a front part of the storage unit tray, a cooling fan is provided at the front part of the case main frame body; flip racks are provided at a rear part and a middle position of the storage unit tray, both sides of one end of the flip rack are hinged to the storage unit tray, a first lug is provided on both sides of the lower part of one end of the flip rack, several first pinholes are provided on one end of the first lug, a hinge is provided on an upper part of the storage unit tray; one end of the hinge is provided with a second pinhole that matches with the first pinhole, the first pinhole and the second pinhole are movably connected by a pin shaft; a third lug is provided on both sides of an upper part of the other end of the flip rack;

several evenly arranged vertical plates are provided on the flip rack and the front part of the storage unit tray, the lower part of the vertical plate on the front part of the storage unit tray is connected to the storage unit tray by a connecting plate, the lower part of the vertical plate on the flip rack is connected to the flip rack by a connecting plate, a first guide plate is provided on the vertical plate; a second guide plate is provided on one side of an upper part of the first guide plate; brackets for installing hard disks are provided both between the first guide plate and the connecting plate, and between the second guide plate and the first guide plate, the hard disks installed on the front part of the storage unit tray constitute a front-row hard disk module, the hard disks installed on a middle flip rack constitute a middle hard disk module, and the hard disks installed on a rear flip rack constitute a rear-row hard disk module; the front-row hard disk module, middle hard disk module and rear-row hard disk module at least have two layers; the flip rack is provided with a baffle plate on one side, the baffle plate is provided with several first vent holes which are located at the gap between an upper hard disk layer and a lower hard disk layer; first cover plates are provided in gaps between the front-row hard disk module and the middle hard disk module, between the middle hard disk module and the rear-row hard disk module, and between the rear-row hard disk module and a rear wall of the storage unit tray, a second lug is provided on both sides of the front part of the first cover plate and movably connected to the storage unit tray, a lap joint is provided on both sides of the rear part of the first cover plate and lapped on the third lug of the flip rack, and a buckle plate is provided on the outside of the lap joint.

2. The thermally maintainable built-in storage tray structure according to claim 1, wherein the upper part of the vertical plate is provided with a second cover plate which is detachably connected with the vertical plate by screws.

3. The thermally maintainable built-in storage tray structure according to claim 1, wherein the lower part of the flip rack is provided with several sets of second vent holes which are located directly under the hard disks.

4. The thermally maintainable built-in storage tray structure according to claim 1, wherein a first limiting plate is provided on one side of the first pinhole, and an acute angle of 30°-45° is formed between the first limiting plate and the lug.

5. The thermally maintainable built-in storage tray structure according to claim 1, wherein an offset L-shaped second limiting plate is provided on one side of the hinge and located on an upper part of the first pinhole.

6. The thermally maintainable built-in storage tray structure according to claim 1, wherein one side of the upper part of the flip rack is provided with several sets of bosses, each set of bosses comprises two bosses between which a slot is formed, the lower part of the baffle plate is installed within the slot, a hook is provided on one side of the vertical plate, the baffle plate is provided with a hook hole adapted to the hook.

7. The thermally maintainable built-in storage tray structure according to claim 1, wherein a wrench is provided on one side of the bracket and includes an anti-falling portion and a pressing portion, the anti-falling portion is inclined to an inner side of the hard disks and forms an angle of 60°-85° with the bracket, and the pressing portion is integrally formed at one end of the anti-falling portion.

8. The thermally maintainable built-in storage tray structure according to claim 1, wherein the first guide plate is a hollow long strip shaped, and a hollow part of the first guide plate and the lower part of the second guide plate are both provided with a third vent hole.

9. The thermally maintainable built-in storage tray structure according to claim 1, wherein several leak-proof devices are provided on both sides of the first cover plate, one end of the leak-proof device is detachably connected to the first cover plate by screws, and the other end of the leak-proof device is contacted with the hard disk modules.

10. The thermally maintainable built-in storage tray structure according to claim 9, wherein the leak-proof device is a soft brush or soft foam.

11. A thermally maintainable built-in storage tray structure, comprising: a case main frame body; a storage unit tray is positioned within the case main frame body, and wherein the storage unit tray is configured to be positioned at a front end of a server together with a mainboard and a PCI_E, the storage unit tray is moveably connected to the case main frame body and is capable of be pulling out of the case main frame body; a middle flip rack provided at a middle part and a rear flip rack provided at a rear part of the storage unit tray, the middle flip rack and the rear flip rack are hinged to the storage unit tray; wherein a front part of the storage unit tray is configured to install a front-row hard disk module, the middle flip rack is configured to install a middle hard disk module and the rear flip rack is configured to install a rear-row hard disk module; wherein a front first cover plate is provided in a gap between the front-row hard disk module and the middle hard disk module, a middle first cover plate is provided in a gap between the middle hard disk module and the rear-row hard disk module, and a rear first cover is provided in a gap between the rear-row hard disk module and a rear wall of the storage unit tray, respectively; wherein the front, middle and rear first cover plate are moveable, such that at an open position, the front first cover plate allows the middle flip rack being flipped for thermal maintenance, and when the middle flip rack is flipped, the front first cover plate is restored to a normal position to be in contact with a bottom of the middle hard disk module to form a closed air duct between the front-row hard disk module and the middle hard disk module; and at an open position, the middle first cover plate allows the rear flip rack being flipped for thermal maintenance, and when the rear flip rack is flipped, the middle first cover plate is restored to a normal position to be in contact with a bottom of the rear hard disk module to form a closed air duct between the middle hard disk module and the rear hard disk module.

12. The thermally maintainable built-in storage tray structure according to claim 11, wherein leak-proof devices are provided on both sides of the front, middle and rear first cover plate, respectively, and wherein the leak-proof device is a soft brush or soft foam.

13. The thermally maintainable built-in storage tray structure according to claim 11, wherein both sides of the storage unit tray are connected to inner walls on both sides of the case main frame body through ball guide rails.

14. The thermally maintainable built-in storage tray structure according to claim 11, wherein both sides of one end of each of the front, middle and rear flip racks are hinged to the storage unit tray, a first lug is provided on both sides of the lower part of one end of each of the front, middle and rear flip racks, a plurality of first pinholes are provided on one end of the first lug, a hinge is provided on an upper part of the storage unit tray; one end of the hinge is provided with a second pinhole that matches with the first pinhole, the first pinhole and the second pinhole are movably connected by a pin shaft; a third lug is provided on both sides of an upper part of the other end of each of the front, middle and rear flip racks.

15. The thermally maintainable built-in storage tray structure according to claim 12, further comprising:
a plurality of evenly arranged vertical plates provided on each of the front, middle and rear flip racks and the front part of the storage unit tray, a lower part of the vertical plate on the front part of the storage unit tray is connected to the storage unit tray by a connecting plate, a lower part of the vertical plate on each of the front, middle and rear flip racks is connected to each of the front, middle and rear flip racks by a connecting plate, a first guide plate is provided on the vertical plate; a second guide plate is provided on one side of an upper part of the first guide plate.

16. The thermally maintainable built-in storage tray structure according to claim 15, further comprising: brackets for installing hard disks provided both between the first guide plate and the connecting plate, and between the second guide plate and the first guide plate.

17. The thermally maintainable built-in storage tray structure according to claim 16, wherein each of the front, middle and rear flip rack is provided with a baffle plate on one side, and the baffle plate is provided with several first vent holes which are located at a gap between an upper hard disk layer and a lower hard disk layer.

18. The thermally maintainable built-in storage tray structure according to claim 15, wherein a second lug is provided on both sides of the front part of each of the front, middle and rear first cover plates and movably connected to the storage unit tray, a lap joint is provided on both sides of a rear part of the each of the front, middle and rear first cover plates and lapped on a third lug of each of the front, middle and rear flip rack, and a buckle plate is provided on the outside of the lap joint.

19. The thermally maintainable built-in storage tray structure according to claim 1, wherein the lower part of each of the front, middle and rear flip rack is provided with a plurality sets of vent holes which are located directly under the hard disks.

* * * * *